United States Patent [19]
Kawai

[11] Patent Number: 5,943,356
[45] Date of Patent: Aug. 24, 1999

[54] SEMICONDUCTOR LASER WITH FRONT FACE COVERED WITH LAMINATED DIELECTRIC LAYERS WHICH PRODUCE OPPOSITELY ACTING STRESSES

[75] Inventor: Takahiro Kawai, Tokyo, Japan

[73] Assignee: NEC Corporation, Tokyo, Japan

[21] Appl. No.: 08/869,886

[22] Filed: Jun. 5, 1997

[30] Foreign Application Priority Data

Jun. 6, 1996 [JP] Japan ................................ 8-144489

[51] Int. Cl.[6] .............................. H01S 3/19; H01L 27/15; H01L 23/58; H01L 21/20
[52] U.S. Cl. .............................. 372/49; 257/79; 257/632; 438/32
[58] Field of Search .................................. 372/49, 50, 96, 372/99; 359/586, 584; 428/409; 438/32; 257/632, 79

[56] References Cited

U.S. PATENT DOCUMENTS

| | | | |
|---|---|---|---|
| 5,418,799 | 5/1995 | Tada | 372/50 |
| 5,440,575 | 8/1995 | Chand et al. | 372/49 |
| 5,729,567 | 3/1998 | Nakagawa | 372/99 |

FOREIGN PATENT DOCUMENTS

| | | |
|---|---|---|
| 58-111386 | 7/1983 | Japan . |
| 63-228793 | 1/1988 | Japan . |
| 2-162788 | 6/1990 | Japan . |
| 3-253087 | 11/1991 | Japan . |
| 6-268327 | 9/1994 | Japan . |
| 8-56056 | 2/1996 | Japan . |
| 8-298351 | 11/1996 | Japan . |
| 8-307008 | 11/1996 | Japan . |
| 9-298337 | 11/1997 | Japan . |

OTHER PUBLICATIONS

English translation of Japanese patent JP–02–162788 (inventor: Hiranaka et al), Jun. 22, 1990.
English Translation of Japanese Patent Abstract (acession No. 90–162788, patent No. 02–162788), Jun. 1990.
Japanese Office Action dated Mar. 17, 1998 with English language translation of Japanese Examiner's comments.

*Primary Examiner*—Rodney Bovernick
*Assistant Examiner*—Quyen Phan Leung
*Attorney, Agent, or Firm*—Whitham, Curtis & Whitham

[57] ABSTRACT

In a semiconductor laser, a first dielectric layer is formed on the front face of a laser diode for producing a compressive stress, and a second dielectric layer is formed on the first dielectric layer for producing a tensile stress for counteracting the compressive stress of the first dielectric layer. The first dielectric layer is formed of a substance such as $Al_2O_3$ and the second dielectric layer is formed of a substance such as $SiN_x$. A high stability into is created between the first dielectric layer and the front face of the laser diode to prevent it from suffering from a castrophic optical damage.

26 Claims, 1 Drawing Sheet

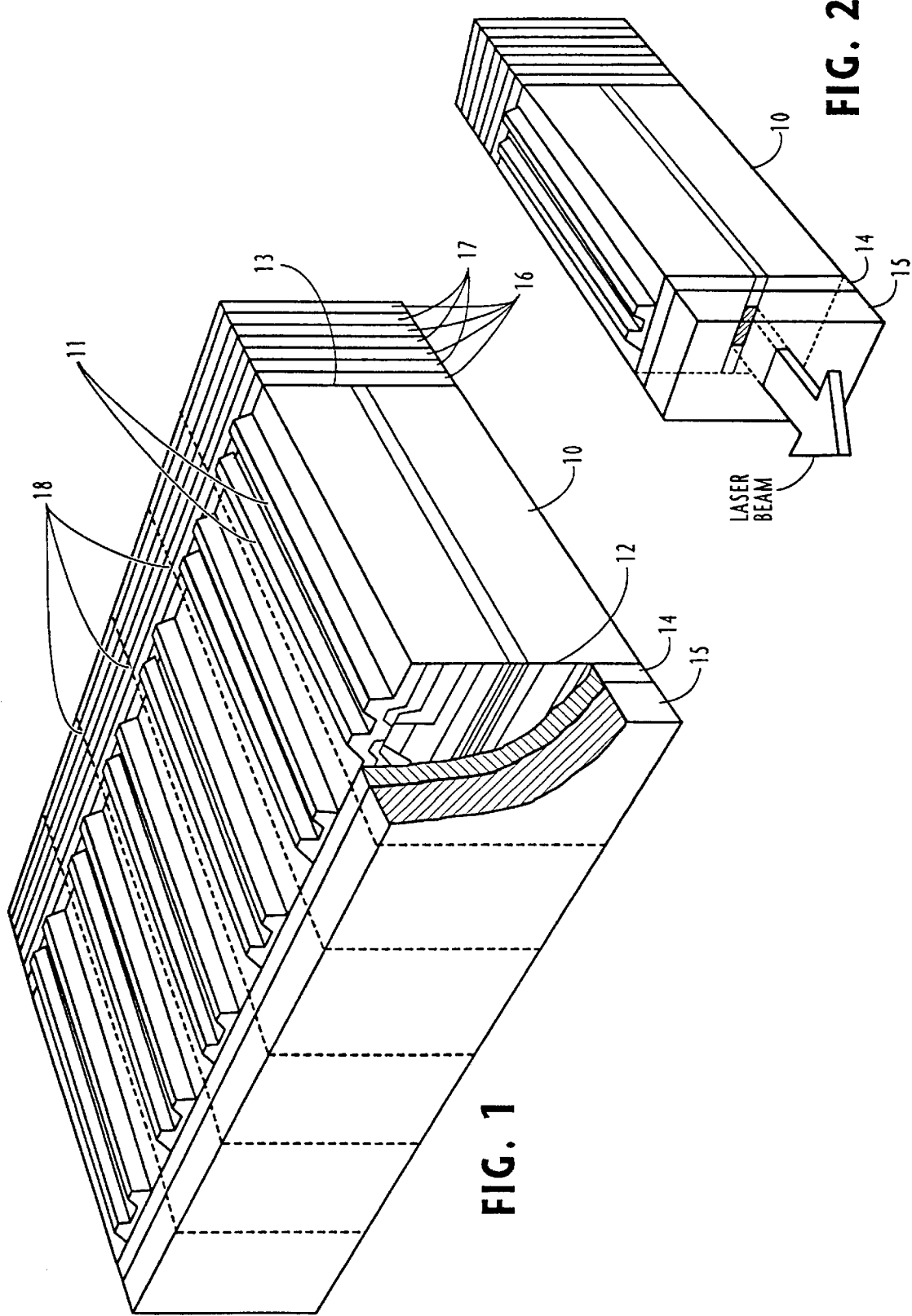

SEMICONDUCTOR LASER WITH FRONT FACE COVERED WITH LAMINATED DIELECTRIC LAYERS WHICH PRODUCE OPPOSITELY ACTING STRESSES

BACKGROUND OF THE INVENTION

1. Field of the Invention

The present invention relates to semiconductor lasers. Specifically, the present invention is concerned with the prevention of catastrophic optical damages (COD) on semiconductor lasers that occur during a continued high power operation.

2. Description of the Related Art

It is generally known that semiconductor lasers of heterostructure such a AlGaAs and AlGaInP are vulnerable to a catastrophic optical damage of their front office due to increased surface temperature which is caused by localized absorption of light The amount of light absorbed at the front face increases with surface oxidation and increased number of lattice defects. Since an increase in surface temperature causes a narrowing of the forbidden band in the neighborhood of the front face, a vicious circle of increasing temperature begins, which finally results in a fused front face, A number of window facet structures have been developed to solve this problem by using materials of high transmissivity. However, these window facet structures are very complex and their productivity is low.

SUMMARY OF THE INVENTION

It is therefore an object of the present invention to provide a simple and yet effective solution to the problem of catastrophic optical damages on semiconductor lasers.

The present invention is based on a finding that the stress which is produced at the front face of a semiconductor laser by a continued high power operation is one of the causes that lead to lattice defects. Therefore, the lowering of stress at the front face of a semiconductor laser allows it to operate continuously without suffering from a catastrophic optical damage.

According to the present invention, there is provided a semiconductor laser comprising a laser diode having a transmissive front face and a reflective rear face, a first dielectric layer formed on the front face of the laser diode for producing a stress, and a second dielectric layer formed on the first dielectric layer for producing a stress which counteracts the stress produced by the first dielectric layer. More specifically, the first dielectric layer is formed of a substance selected from the group consisting of aluminum oxide, aluminum nitride, silicon oxide, silicon nitride, silicon carbonate and titanium oxide.

BRIEF DESCRIPTION OF THE DRAWINGS

The present invention will be described in further detail with reference to the accomnpanying drawings, in which:

FIG. 1 is a partially broken, perspective view of a semiconductor laser bar constructed according to the present invention before being sliced into laser diode elements; and FIG. 2 is a perspective view of one of the sliced laser diode element.

DETAILED DESCRIPTION

Referring now to FIG. 1, the semiconductor laser of the present invention comprises a semiconductor laser bar 10 fabricated according to any known technology. The laser bar 10 is formed with a plurality of identical InGaAs quantum well, transverse-mode laser diode elements. Each element has its top layer (magnesium-doped GaAs) formed into parallel ridges 11 as a result of the underlying inverted-V (mesa) structure that causes electrons to converge toward the active region of the diode. Laser bar 10 has a front, light transmissive ace 12 and a rear, light reflective face 13.

Before the laser bar 10 is sliced into individual diode elements along dotted-lines indicated by numeral 18, a first dielectric layer 14 and a second dielectric layer 15 are successively formed on the front face 12. The first dielectric layer 14 is composed of $Al_2O_3$ which is deposited to a thickness of 55 nanometers. The second dielectric layer 15 is composed of $SIN_x$ which is deposited on the first layer 14 to a thickness of 90. Sputtering technique is preferable to form these layers at 150° C.

Following the above process, $Al_2O_3$ layers 16 and amorphous Si layers 17 are alternately laminated on the reflective face 13 at a temperature of 120° C. using a sputtering method, to obtain a reflectivity of 95%.

The laser bar is then sliced along i dotted-lines 18 normal to the a plane of the front face 12 to produce a plurality of laser diodes, one of which is shown in FIG. 2.

The first dielectric layer 14 produces a compressive stress of typically $3 \times 10^8$ $dyn/cm^2$. The second dielectric layer 15 produces a tensile stress of typically $2.7 \times 10^8$ $dyn/cm^2$. The tensile stress of the second layer 15 counteracts the compressive stress of the first layer 14, leaving a compressive stress of $3 \times 10^7$ $dyn/cm^2$ to be exerted on the front face 12. Therefore, the sty of the laser diode at the front face 12 is reduced and can be maintained at a low level. In addition, the second layer 15 has the effect of reducing the total reflectivity of the front face 12 to 3%.

The lamination of the dielectric layers of oppositely acting stresses cancels not only the stresses resulting from a difference between heir thermal expansion coefficients, but also from the intrinsic stresses of their materials produced during the formation of these layers. As a result, lattice defects which would otherwise be caused by stress due to continued high power operation are reduced to a minimum and a high stability interface is formed between the laminated dielectric structures 14, 15 and the front face 12. Catastrophic optical damage (COD) of the semiconductor laser is therefore effectively prevented.

Materials suitable for the first dielectric layer 14 include those having high adhesion to the surface of a semiconductor, high transmissivity to radiation at laser wavelengths, and high thermal and chemical stability, such as oxides, nitrides or carbonates of aluminum, silicon or titanium. Suitable materials are $Al_2O_3$, AlN, $SiN_x$, SiC, $SiO_2$ and $TiO_2$. Among these, $Al_2O_3$, $SiN_x$ and SiC are most preferred because of the ease with which the compressive stress can be controlled. Materials suitable for the second dielectric layer 15 include those having high adhesion to the first dielectric layer 14, high transmissivity to radiation at laser wavelengths, and high thermal and chemical stability. The material for the second layer 15 is chosen from those of the first dielectric layer to form a counteractive pair.

If $SiN_x$ is used for the first layer 14, $Al_2O_3$ could be used for the second layer 15. SiC and $SiN_x$ can also be used for the first and second layers, respectively.

What is claimed is:

1. A semiconductor device comprising:
    a transmissive front face;
    a reflective rear face;
    a first dielectric layer formed on the front face for producing a stress; and a second dielectric layer formed on the first dielectric layer for producing a stress which counteracts the stress produced by the first dielectric layer to a degree sufficient to leave a desired non-zero stress on the front face.

2. A semiconductor device as claimed in claim 1, wherein the first dielectric layer is formed of a substance selected from the group consisting of aluminum oxide, aluminum nitride, silicon oxide, silicon nitride, silicon carbonate and titanium oxide.

3. A semiconductor device as claimed in claim 1, wherein the first dielectric layer is formed of a substance selected from the group consisting of $Al_2O_3$, $SiN_x$ and SiC, and the second dielectric layer is formed of a substance selected from said group, the substance of the second dielectric layer being different from the substance of the first dielectric layer.

4. A semiconductor device as claimed in claim 1, wherein the stresses produced by the first and second dielectric layers are compressive and tensile stresses respectively.

5. The semiconductor device of claim 1, wherein said semiconductor device is a semiconductor laser, and wherein the transmissive front face and the reflective rear face are faces of a laser diode within said semiconductor laser.

6. The semiconductor device of claim 5, wherein the first dielectric layer and the second dielectric layer are laminated.

7. The semiconductor device of claim 5, wherein said desired stress reduces a strain induced on the front face of the laser diode by temperature increases that occur during operation of said laser diode, said strain reduction reducing a likelihood of lattice defects forming on the front face as a result of said temperature increases.

8. The semiconductor device of claim 5, wherein the stress produced by the second dielectric layer is a tensile stress and the stress produced by the first dielectric layer is a compressive stress.

9. The semiconductor device of claim 8, wherein the stress produced by the first dielectric layer is greater than the stress produced by the second dielectric layer, so that said desired stress is a compressive stress.

10. The semiconductor device of claim 9, wherein said desired stress is $3 \times 10^7$ dyn/cm$^2$.

11. The semiconductor device of claim 10, wherein the compressive stress produced by the first dielectric layer is $3 \times 10^8$ dyn/cm$^2$ and the tensile stress produced by the second dielectric layer is $2.7 \times 10^8$ dyn/cm$^2$.

12. The semiconductor device of claim 5, wherein the second dielectric layer reduces a total reflectivity of the front face of the laser diode.

13. The semiconductor device of claim 12, wherein the second dielectric layer reduces the total reflectively to 3%.

14. The semiconductor device of claim 5, wherein the first dielectric layer and the second dielectric layer are made from a material selected from a group consisting of oxides, nitrides, and carbonates of aluminum, silicon, and titanium.

15. The semiconductor device of claim 14, wherein the first dielectric layer has a thickness of 55 nanometers and the second dielectric layer has a thickness of 90 nanometers.

16. The semiconductor device of claim 5, wherein the first dielectric layer is formed of a substance selected from the group consisting of $Al_2O_3$, $SiN_x$, SiC, and the second dielectric layer is formed of a substance selected from said group, the substance of the second dielectric layer being different from the substance of the first dielectric layer.

17. The semiconductor device of claim 5, wherein the reflective rear face of the laser diode includes alternating, laminated layers of $Al_2O_3$ and amorphous silicon.

18. A method for fabricating laser diodes, comprising the steps of:

preparing a semiconductor laser bar having a light transmissive front face and a reflective rear face;

forming a first dielectric layer on the front face of the bar, the first dielectric layer producing a stress;

forming a second dielectric layer on the first dielectric layer, the second dielectric layer producing a stress which counteracts the stress produced by the first dielectric layer to a degree sufficient to leave a desired non-zero stress on the front face; and slicing the semiconductor laser bar along a plurality of lines normal to the plane of the front face to produce the laser diodes.

19. The method of claim 18, wherein the first dielectric layer is formed of a substance selected from the group consisting of aluminum oxide, aluminum nitride, silicon oxide, silicon nitride, silicon carbonate and titanium oxide.

20. The method of claim 18, wherein the first dielectric layer is formed of a substance selected from the group consisting of $Al_2O_3$, $SiN_x$ and SiC, and the second dielectric layer is formed of a substance selected from said group, the substance of the second dielectric layer being different from the substance of the first dielectric layer.

21. The method of claim 18, wherein the stresses produced by the first and second dielectric layers are compressive and tensile stresses.

22. The method of claim 18, further comprising:

laminating the first dielectric layer and the second dielectric layer.

23. The method of claim 18, wherein said desired stress reduces a strain induced on the front face of the laser diode by temperature increases that occur during operation of said laser diode, said strain reduction reducing a likelihood of lattice defects forming on the front face as a result of said temperature increases.

24. The method of claim 18, wherein the stress produced by the first dielectric layer is greater than the stress produced by the second dielectric layer, so that said desired stress is a compressive stress.

25. The method of claim 24, wherein said desired stress is $3 \times 10^7$ dyn/cm$^2$.

26. The method of claim 25, wherein the compressive stress produced by the first dielectric layer is $3 \times 10^8$ dyn/cm$^2$ and the tensile stress produced by the second dielectric layer is $2.7 \times 10^8$ dyn/cm$^2$.

* * * * *